United States Patent [19]

Leonard

[11] Patent Number: 5,205,028
[45] Date of Patent: Apr. 27, 1993

[54] WAFER ALIGNMENT FIXTURE FOR WAFERS HAVING NOTCHES AND/OR FLATS

[75] Inventor: Thomas E. Leonard, Parsippany, N.J.

[73] Assignee: Silicon Technology Corporation, Oakland, N.J.

[21] Appl. No.: 678,604

[22] Filed: Apr. 1, 1991

[51] Int. Cl.⁵ .............................................. B23R 5/22
[52] U.S. Cl. ............................. 29/271; 269/289 MR; 269/903
[58] Field of Search ................... 269/287, 254 R, 903, 269/20, 289 MR, 289 R, 295, 156, 13, 14; 279/46 R, 4, 50, 23 R, 35-37, 79, 106-107; 29/271

[56] References Cited

U.S. PATENT DOCUMENTS

| | | | |
|---|---|---|---|
| 2,424,090 | 7/1947 | Gordinier | 269/234 |
| 2,722,867 | 11/1955 | Dackor et al. | 269/234 |
| 2,733,330 | 1/1956 | Blewett | 269/289 MR |
| 2,781,930 | 2/1957 | Menser et al. | 269/289 MR |
| 3,619,158 | 11/1971 | Gogolya | 269/156 |
| 4,877,228 | 10/1989 | Ripert | 269/156 |
| 4,970,772 | 11/1990 | Steere | 29/271 |

Primary Examiner—Robert C. Watson
Attorney, Agent, or Firm—Francis C. Hand

[57] ABSTRACT

The wafer alignment fixture is provided with a cassette support which can be slid between two positions on a base plate. In one position, the cassette support is aligned with a roller in order to align notched wafers with each other. In the second position, the cassette support is aligned with a second roller so as to effect alignment of wafers having flats.

21 Claims, 4 Drawing Sheets

WAFER ALIGNMENT FIXTURE FOR WAFERS HAVING NOTCHES AND/OR FLATS

This invention relates to a wafer alignment fixture. More particularly, this invention relates to a wafer alignment fixture for wafers having a notch or a flat or both a notch and a flat on a periphery.

As is known, various types of cassettes have been provided for conveying a plurality of wafers, such as silicon wafers, from place to place. In some cases, the wafers have been formed with a small notch in the periphery for identification purposes and subsequent operations. In order to align such wafers in the cassettes, it has been known to use a wafer alignment fixture such as described in U.S. Pat. No. 4,970,772. As described therein, the fixture includes a cassette support means to receive a cassette containing a row of wafers as well as a roller to lift the wafers within the cassette and to rotate the wafers until the notch in each wafer comes into alignment with the roller. When this occurs, each wafer will "drop" down over the roller so that the notch receives the roller and continued rotation of the wafer will cease. The alignment fixture also has a wafer support means for supporting each wafer when a notch has been aligned with the roller and the roller is positioned within the notch.

In some cases, it has also been known to provide a wafer with a flat for identification purposes.

Accordingly, it is an object of the invention to provide a wafer alignment fixture which can be used to align wafers having notches as well as wafers having flats.

It is another object of the invention to provide a relatively simple wafer alignment fixture which can be operated in one of two conditions depending upon the presence of a notch or a flat on the wafers to be aligned within a cassette.

It is another object of the invention to simplify the construction of known wafer alignment fixtures for aligning wafers having notches herein.

Briefly, the invention provides a wafer alignment fixture which comprises a cassette support means for supporting a cassette containing a row of wafers at least some of which have a peripheral notch and/or a flat thereon and means for moving the support means between a first position and a second position.

In addition, the fixture has a first roller disposed below the cassette to frictionally contact the row of wafers with the support means in the first position and to lift the wafers within the cassette. A means is also provided for rotating this roller to cause the wafers in frictional contact with the roller to rotate within the cassette in order to bring a notch of a respective wafer into alignment with the roller. Still further, a wafer support assembly is provided for supporting each respective wafer which has a notch receiving the roller therein.

The fixture also has a second roller below the cassette to frictionally contact the row of wafers when the support means is in the second position in order to lift the wafers within the cassette. A means for rotating the second roller is also provided to cause the wafers in frictional contact therewith to rotate within the cassette in order to bring a flat of a respective wafer into alignment with the roller while lowering the wafer within the cassette.

When in use, a cassette is disposed on the support means and the support means moved into one of the two positions depending upon whether the wafers have a notch or a flat thereon for positioning purposes. For example, where the wafers have notches, the alignment fixture operates in a similar matter as described in pending U.S. Pat. No. 4,970,772.

In order to align a series of wafers by means of flats thereon, the cassette support means is shifted into the second position so that the second roller is aligned with and lifts up the wafers within the cassette. Rotation of the second roller causes the wafers to rotate until a flat comes onto the roller. At that time, the wafer would begin to descend within the cassette until the wafer comes to rest on the side walls of a cassette. Continued rotation of the wafer is then impeded.

The wafer support assembly for the fixture is constructed with a support having a pair of spaced, parallel upstanding walls which define wafer support surfaces. These walls cooperate with the first roller so as to receive the roller in spaced relation therebetween. In addition, the support assembly has a dowel pin disposed in parallel to the roller between the walls of the support so as to support the roller thereon, for example, against sagging of the roller. A means is also provided for adjustably supporting the dowel pin in order to raise and lower the pin relative to the walls. A screw is also provided which is rotatably mounted in the support for actuating the adjusting means in response to rotation of the screw in order to move the dowel pin relative to the walls. Thus, should the roller require lifting at an intermediate point, the screw can be rotated so as to effect raising of the dowel pin and thus the roller thereon.

These and other objects and advantages of the invention will come more apparent from the following detailed description taken in conjunction with the accompanying drawings wherein.

Figure 1:
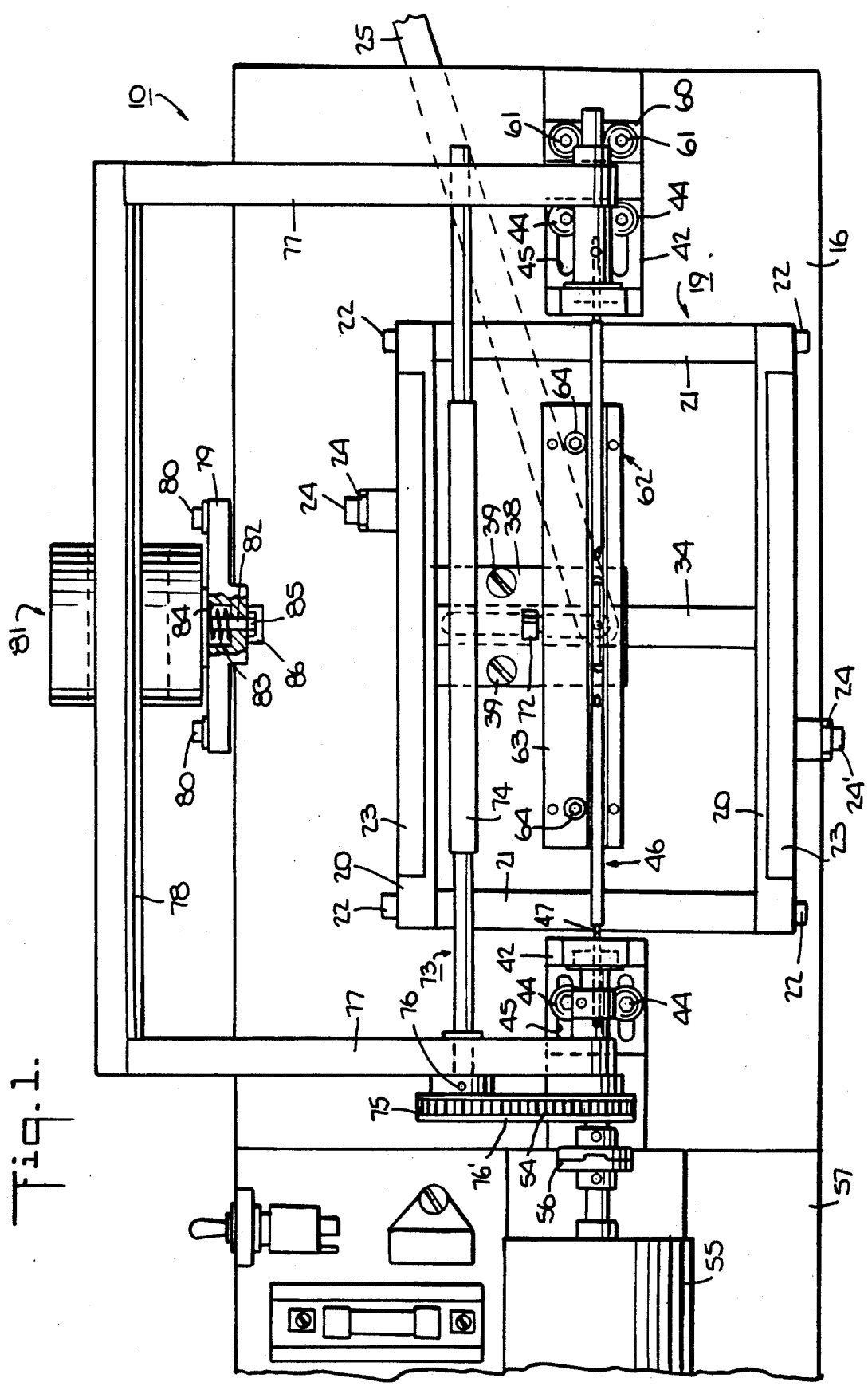
FIG. 1 illustrates a plan view of a wafer alignment fixture constructed in accordance with the invention.
Figure 2:
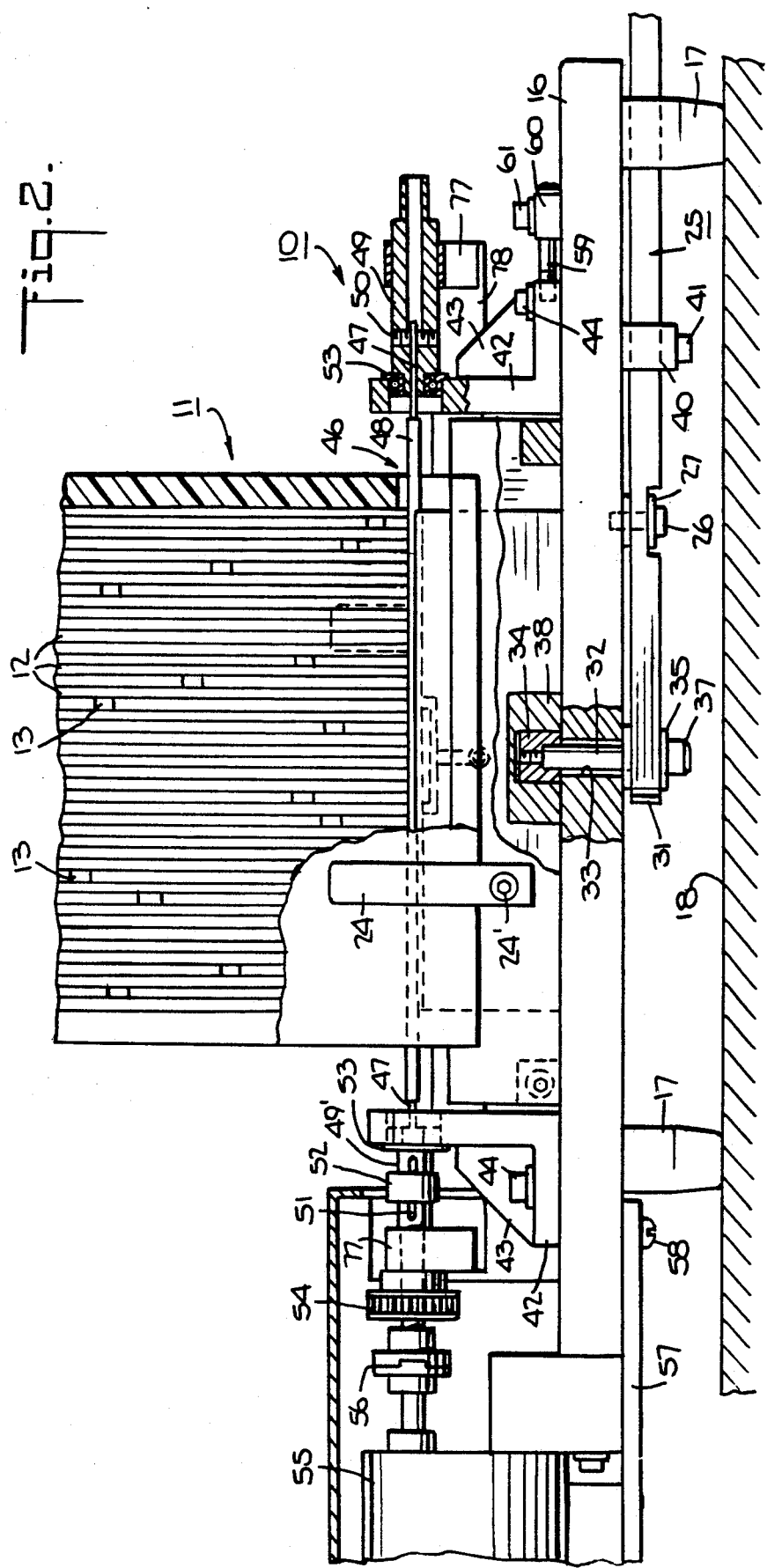
FIG. 2 illustrates a side view, partly in cross-section of the fixture of FIG. 1.
Figure 3:
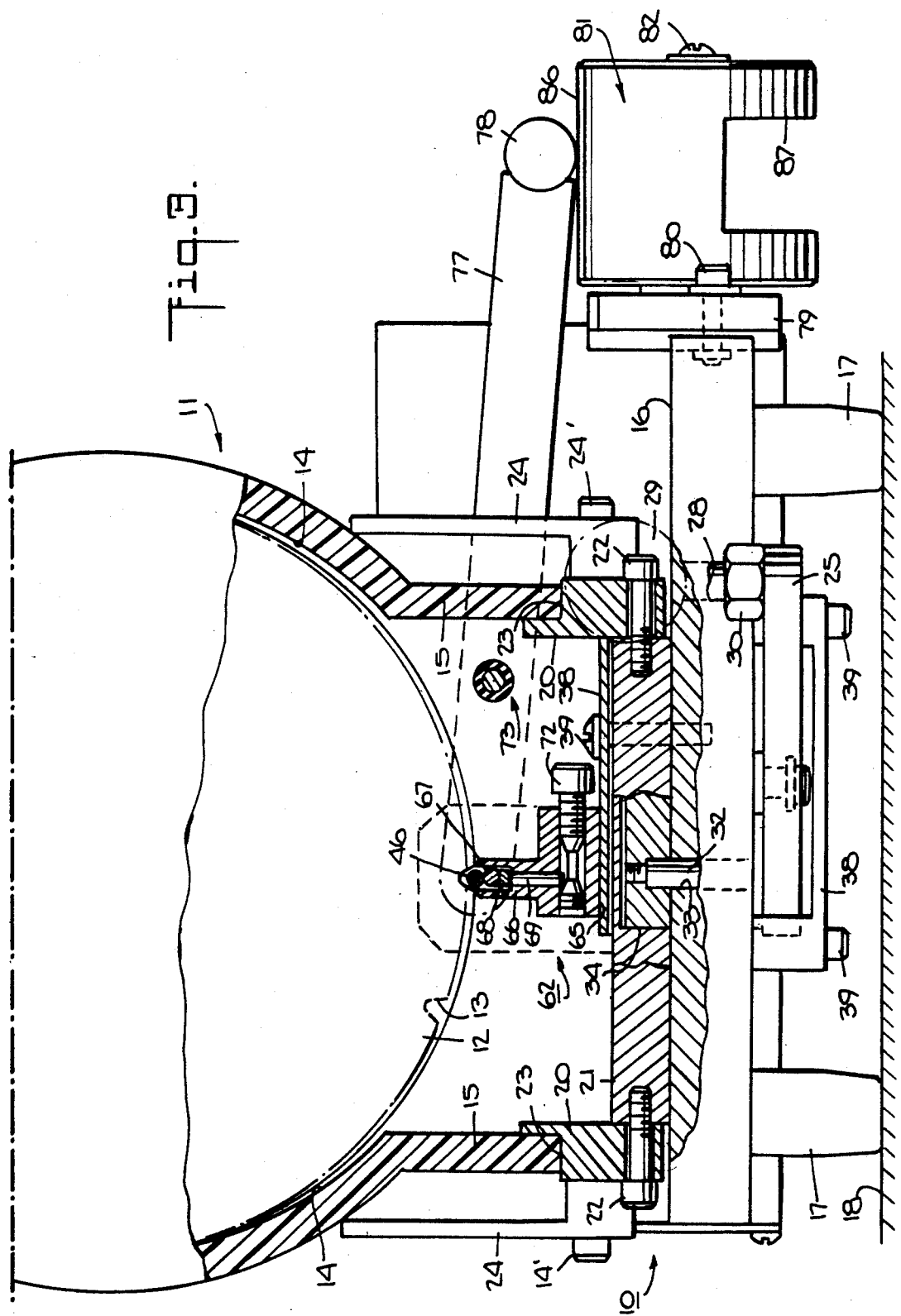
FIG. 3 illustrates a cross-sectional view of the wafer alignment fixture with a cassette support means in a first position for the alignment of wafers with notches.

Referring to FIGS. 1 and 2, a wafer alignment fixture 10 is constructed along the lines described in the above noted U.S. Pat. No. 4,970,772. For example, the fixture 10 is constructed to receive a cassette 11 containing a row of wafers 12 at least some of which are provided with notches 13. The cassette 11 is of generally conventional structure and need not be described in detail. As indicated in FIG. 3, the cassette has a pair of curvilinear side walls 14 which are sized so as to seat a wafer 12 thereon in upstanding manner. The cassette 11 may also be provided with ribs (not shown) to act as spacers between the wafers 12. In addition, the cassette 11 has a pair of depending walls 15.

The wafer alignment fixture 10 includes a base plate 16, for example, of rectangular shape which has depending legs 17 (see FIG. 2) secured thereon for mounting on a suitable support surface 18. In addition, a cassette support means 19 is slidably mounted on the plate 16 for movement between two positions as described below.

Referring to FIGS. 1 and 3, the cassette support means 19 is in the form of a rectangular frame having a pair of parallel upstanding walls 20 and a pair of transverse bars 21 which are secured by screws 22 to and between the walls 20. As indicated, each wall 20 has a recessed shoulder 23 for receiving a wall 15 of the cassette 11 (see FIG. 3). In addition, a guide 24 is secured as by a bolt 24' to each wall 20 and extends upwardly therefrom in order to slidably guide the cassette 11 (see FIG. 3).

Referring to FIGS. 1 and 2, the fixture 10 also includes a means for moving the cassette support means 19 between two positions. This means includes a lever 25 which is pivotally mounted as by a bolt 26 and washer arrangement 27 to the underside of the base plate 16.

As indicated in FIG. 3, a free end of the lever 25 extends from under the base plate 16 and is provided with a screw 28 which is threaded into the end of the lever 25, a knob 29 which is threaded onto the top of the screw 28 and a pair of lock nuts 30 (only one of which is shown) to lock the knob 29 to the screw 28 and the screw 28 to the lever 25. Manual grasping of the knob 29 permits pivoting of the lever 25 about the pivot bolt 26.

As indicated in FIG. 2, the end of the lever 25 under the base plate 16 has a bore 31 of elongated shape through which a bolt 32 passes. The bolt 32 also passes through an elongated slot 33 in the base plate 16 into threaded engagement with a slider 34 slidably mounted on the top surface of the base plate 16 and secured to a side wall 20 of the support means 19. A washer 35 is also disposed between a head 37 of the bolt 32 and the lever 25.

As indicated in FIGS. 1 and 2, the slider 34 is slidably mounted within a groove of a guide 38 fixedly mounted on the base plate 16 by screws 39.

Upon pivoting of the lever 25, the slider 34 is able to move from the position shown in FIG. 1 to a displaced position within the guide 38. During this time, the bolt 32 moves within the elongated slot 33 in the base plate 16 while also moving within the elongated bore 31 of the lever 25. With the slider 34 secured to a side wall 20 of the support means 19, movement of the lever 25 causes movement of the cassette support means 19.

Referring to FIG. 2, a U-shaped bracket 40 is secured as by bolts 41 to the underside of the base plate 16 so as to limit the extent of pivoting motion of the lever 25 as well as to establish the two positions of the cassette support means 19 to function as described below.

Referring to FIGS. 1 and 2, the alignment fixture 10 also has a pair of brackets 42 mounted on the base plate 16. Each bracket 42 is of L-shaped cross-section and is provided with a transverse reinforcing web 43. Also, each bracket 42 is secured to the base plate 16 by a pair of bolts 44 disposed to opposite sides of the web 43. As illustrated in FIG. 2, each bracket 42 has an elongated slot 45 receiving a bolt 44 to permit longitudinal adjustment of the brackets 42 towards and away from each other on the base plate 16.

The brackets 42 serve as a means for rotatably mounting a roller 46 formed of a wire 47 and a frictional plastic tube or cover 48, for example, a cover 48 made of elastomeric material, such as polyurethane or other suitable plastic material. For example, the wire may be of 1/16 inch diameter while the plastic tube has a wall thickness of 1/32 inch.

Referring to FIG. 2., in order to rotably mount the roller 46 in a respective bracket 42, one end of the wire 47 is exposed and inserted into a central bore of a stub shaft 49 and secured in place by a transversely disposed set screw 50. The other wire end is exposed and inserted into a stub shaft 49' having one or more longitudinal slots 51 and secured in place by a clamping collar 52 about the stub shaft 49'. Each stub shaft 49, 49' in turn, supports a thrust bearing 53 at one end which, in turn, is journaled in a bracket 42. In addition, one stub shaft 49' carries a gear 54.

As indicated in FIGS. 1 and 2, a means in the form of an electric motor 55 is secured to the stub shaft 49' via a coupling 56 in order to cause rotation of the roller 46. As indicated, the motor 55 is mounted on a plate 57 which is secured to and which extends from under the base plate 16. Suitable screws 58 are provided for this purposes.

Referring to FIG. 2, a means for tensioning the wire 47 of the roller 46 is provided in order to eliminate sag due to the weight of the wafers 12 on the roller 46. This tensioning means includes an adjusting screw 59 which passes through a block 60 secured by a pair of bolts 61 to the base plate 16 adjacent the right-hand end bracket 42 a viewed. In addition, the adjusting screw 59 threads into the right-hand bracket 42. Thus, upon turning of the screw 59, the right-hand bracket 42 ma be moved longitudinally relative to the left-hand bracket 42. This movement is carried out while the bolts 44 securing the right-hand bracket 42 are loosened so as to permit a longitudinal adjustment and, thus, tensioning of the roller 46.

Referring to FIGS. 1 and 3, the alignment fixture 10 also includes a wafer support assembly 62 for supporting each wafer 12 after a notch has been aligned with the roller 46, for example as indicated in FIG. 3.

Referring to FIGS. 1 and 2, the wafer support assembly 62 is formed by a support 63 which is secured as by bolts 64 to the base plate 16 in parallel between the walls 20 of the cassette support means 19 which serve to mount the cassette 11. In addition, the support 63 has a transverse opening 65 (See FIG. 3) though which the guide 38 passes. The support 63 also has a pair of upstanding walls 66 which are radiused to define support surfaces of curvilinear shape in order to receive a peripheral edge of a wafer 12 thereon (see FIG. 3). The walls 66 are parallel to the roller 46 and straddle the roller 46 while defining a recess into which the roller 46 projects. As indicated, the roller 46 is disposed outwardly of the walls 66.

The wafer support assembly 62 also includes a horizontally disposed dowel pin 67 in parallel between the walls 66 on an axis disposed longitudinally of the walls 66 in order to support the roller 46 thereon against sag. A means is also provided for adjustably supporting the dowel pin 67 for raising and lowering of the pin 67 relative to the walls 66. As indicated, this includes a flat bar 68 which extends along the dowel pin 67 and which supports the dowel pin 67 horizontally thereon. In addition, a vertically disposed dowel pin 69 supports the bar 68. This dowel pin 69, in turn, rests on a conical cam surface 70 within a recessed intermediate portion 71 of an actuating screw 72. This screw 72 is rotatably mounted in the support 63 for actuating the vertical dowel pin 69 so as to raise or lower the horizontal dowel pin 67 relative the to the roller 46.

Referring to FIG. 1, a second roller 73 is disposed in parallel to the first roller 46 and is provided with a friction covering 74 of elastomeric material. As indicated, the second roller 73 carries a gear 75 at one end which is secured thereon as by a set screw 76 and which is connected by a belt 76' to the gear 54 on the first roller 46. In this way, the rotation of the first roller 46 by the motor 55 causes a simultaneous rotation of the second roller 73.

In addition, the second roller 73 is rotatably mounted at the ends in a pair of arms 77 each of which is pivotably mounted on and about a stub shaft 49, 49'. These two arms 77 are interconnected by a bar or handle 78. This handle 78 serves to move the roller 73 from a rest position (See FIG. 4) spaced from a row of aligned wafers 12 within the cassette 11 and a raised position, as shown in dotted line, frictionally engaging a row of aligned wafers 12 in order to rotate the wafers in unison into a predetermined position.

As also indicated in FIG. 1, a bracket 79 is secured to the side of the base plate 16 as by mounting bolts 80. In addition, a handle holder 81 is secured to the bracket 79 by a screw 82 which passes through the holder 81 into the bracket 79. In addition, a coiled spring 83 is disposed about the screw 82 within a recess 84 of the bracket 79 so as to maintain tension on the holder 81. As indicated, the screw 82 is threaded into a nut 85 disposed on an opposite side of the bracket 79 with a suitable opening 86 provided to obtain access to the nut 85.

Referring to FIG. 3, the handle holder 81 is provided with a rounded surface 86 upon which the handle 78 rests when in the position illustrated. In addition, the holder 81 has a recess 87 for receiving the handle 78 for example when rotated about the bolt 82 into the solid line position shown in FIG. 4. This position corresponds to the second position of the cassette support means 19.

Referring to FIGS. 2 and 3, in order to utilize the wafer alignment fixture 10 for aligning wafers 12 with notches 13, the cassette support means 19 is disposed in the illustrated position. In this first position, the roller 46 is able to lift the wafers 12 within the cassette 11 and to cause rotation of the wafers 12 upon rotation of the roller 46. In turn, the notches 13 of wafers 12 become aligned over roller 46. The cassette 11 can now be removed. Also, lever 25 can be pivoted from the position indicated in FIG. 3 to the position in FIG. 4 in order to cause the cassette support means 19 to slide across the base plate 16 in order to further rotate the aligned wafers 12 into another position. The handle 78 is not moved in the operation thus the handle is in the dotted line position in FIG. 4. The operation of the fixture 10 for notched wafers differs from the copending U.S. patent application. In both, the notches are aligned in the same manner but in the previous construction, the aligned notched wafers were rotated by lifting a roller similar to 73 instead of shifting the cassetee of wafers over the roller 73.

In the event that roller 46 requires less sag, the screw 72 can be rotated manually so as to move the vertical dowel pin 69 upwardly and, thus, the horizontal dowel pin 67 and roller 46 resting thereon upwardly.

Figure 4:
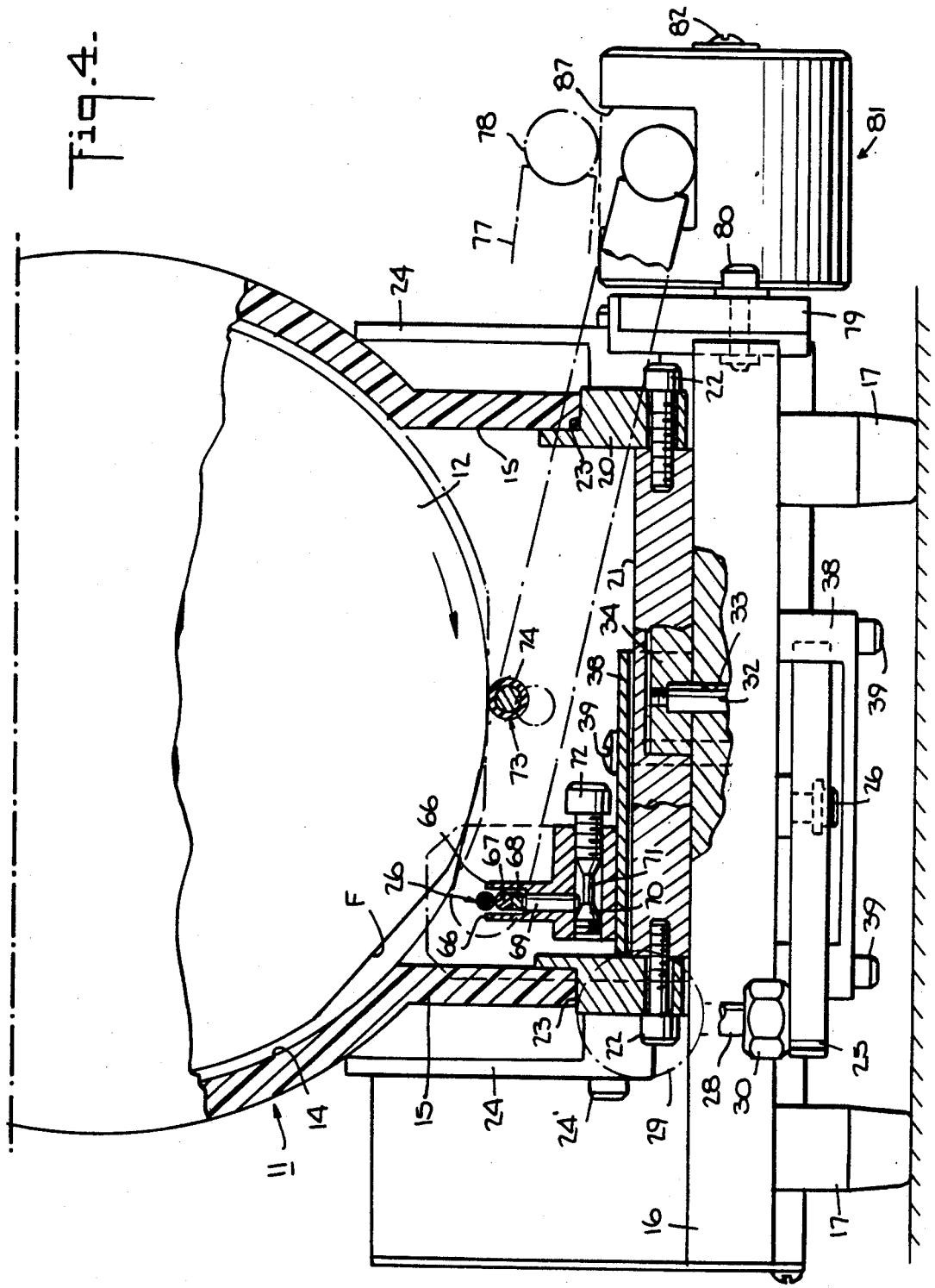
FIG. 4 illustrates a view similar to FIG. 3 of the cassette support means in a second position for the alignment of wafers having flats in accordance with the invention.

In the event that the wafers 12 have flats or flats and notches, the flatted feature F can be aligned. The handle holder 81 is rotated and the handle 78 is received within recess 87 as shown in FIG. 4. In addition, the lever 25 is pivoted from the position indicated in FIG. 1 to the position indicated in FIG. 4, in order to cause the cassette support means 19 to slide across the base plate 16 from the position shown in FIG. 3 to the position shown in FIG. 4. In this latter position, the second roller 73 is aligned with the center line of the wafers 12 within the cassette 11 and the wafers 12 are lifted from the curved walls 14 of the cassette 11. Thereafter, as the wafers 12 rotate on the roller 73 (e.g. clockwise as viewed), the flats F move onto the roller 73. At this time, the wafers "drop" onto the side walls 14 of the cassette 11. When the mid-point of a flat F of a given wafer approaches the roller 73, the flat F becomes spaced from the roller 73. At this time, further rotation of the wafer 12 is not possible.

After the wafers have been aligned with the flats, thus out of contact with the roller 73, the handle holder 81 can be rotated into the dotted position shown in FIG. 4 so as to engage the roller 73 against the wafers so that all of the wafers can be rotated in unison to another position if required.

The invention thus provides a wafer alignment fixture which may accommodate wafers having notches and/or flats. Further, the invention provides a wafer support assembly which can be readily adjusted in order to compensate for sag in a roller used for aligning a series of notched wafers.

The invention further provides a wafer alignment fixture which can be used to align wafers having notches therein and to subsequently rotate the aligned wafers into another position for transport purposes or the like.

What is claimed is:

1. A wafer support assembly for a wafer alignment fixture, said assembly comprising
    a support having a pair of spaced parallel upstanding walls defining wafer support surfaces at the upper ends;
    a dowel pin disposed in parallel between said walls on an axis disposed longitudinally of said walls to support a roller thereon while contacting an outer surface of the roller;
    means for adjustably supporting said dowel pin in said support for raising and lowering said pin relative to said walls, said means including a flat bar supporting said dowel pin horizontally thereon and a vertically disposed dowel pin supporting said bar support thereon; and
    a screw rotatably mounted in said support for actuating said means in response to rotation of said screw to move said dowel pin relative to said walls.

2. A wafer support assembly as set forth in claim 1 wherein said screw includes a recessed intermediate portion having at least one conical cam surface abutting a lower end of said vertically disposed dowel pin.

3. A wafer alignment fixture for wafers comprising
    cassette support means for supporting a cassette containing a row of wafers, at least some of said wafers having one of a peripheral notch and a flat therein;
    means for moving said support means between a first position and a second position;
    a first roller extending within said support means and below a supported cassette to frictionally contact a row of wafers therein with said support means in said first position and to lift the wafers within the cassette;
    first means for rotating said first roller to cause the wafers in frictional contact with said first roller to rotate within the cassette to bring a notch of a respective wafer into alignment with said roller;

a wafer support assembly for supporting each respective wafer having a notch aligned with and receiving said first roller therein;

a second roller extending in spaced parallel relation to said first roller below the cassette to frictionally contact the row of wafers with said support means in said second position and to lift the wafers within the cassette; and second means for rotating said second roller to cause the wafers in frictional contact therewith to rotate within the cassette to bring a flat of a respective wafer into alignment with said second roller while lowering the respective wafer within the cassette.

4. A wafer alignment fixture as set forth in claim 3 wherein said cassette support means includes a pair of parallel walls for supporting a wafer cassette thereon with said rollers extending in parallel between said walls.

5. A wafer alignment fixture as set forth in claim 3 wherein said means includes a shaft secured to one end of said roller and a motor for driving said shaft.

6. A wafer alignment fixture as set forth in claim 3 wherein said wafer support assembly includes a pair of upstanding support surfaces for receiving wafers thereon.

7. A wafer alignment fixture as set forth in claim 3 which further comprises a handle rotatably mounting said second roller therein and being pivotally mounted on said first roller and said second means includes gear means interconnecting said rollers to each other.

8. A wafer alignment fixture as set forth in claim 3 wherein said each roller has an elastomeric peripheral surface.

9. A wafer alignment fixture as set forth in claim 8 wherein said first roller includes a longitudinally extending wire and means for tensioning said wire to eliminate sag due to the weight of the wafers.

10. A wafer alignment fixture as set forth in claim 3 wherein said wafer support assembly comprises a support having a pair of spaced parallel upstanding walls defining wafer support surfaces; a dowel pin disposed between said walls on an axis parallel to said first roller to support said first roller thereon; means for adjustably supporting said dowel pin in said support for raising and lowering said pin relative to said walls; and a screw rotatably mounted in said support for actuating said means in response to rotation of said screw to move said dowel pin relative to said walls.

11. A wafer alignment fixture as set forth in claim 10 wherein said means for supporting said dowel pin includes a flat bar supporting said dowel pin horizontally thereon and a vertically disposed dowel pin supporting said bar support thereon.

12. A wafer alignment fixture as set forth in claim 11 wherein said screw includes a recessed intermediate portion having at least one conical cam surface abutting a lower end of said vertically disposed dowel pin.

13. A wafer alignment fixture as set forth in claim 3 which further comprises a plate slidably mounting said cassette support means thereon and said means for moving said support means includes a lever pivotally mounted on said plate and secured at one end to said support means.

14. A wafer alignment fixture as set forth in claim 13 wherein said means for moving said cassette support means includes a guide secured to said plate and a slider secured to and between said lever and said cassette support means, said slider being slidably mounted in said guide for moving said support means transversely of said rollers.

15. A wafer alignment fixture as set forth in claim 3 which further comprises a handle rotatably mounting said second roller therein and being pivotally mounted about an axis of said first roller.

16. A wafer alignment fixture as set forth in claim 15 which further comprises a plate slidably supporting said cassette support means thereon and a bracket mounted on said plate, said bracket having a first surface for supporting said handle thereon with said support means in said first position and a recessed surface for supporting said handle thereon with said support means in said second position.

17. A wafer alignment fixture as set forth in claim 16 wherein said second roller is disposed in a horizontal plane below said first roller with said handle on said recessed surface of said bracket.

18. A wafer alignment fixture for wafers comprising cassette support means for supporting a cassette containing a row of wafers, at least some of said wafers having one of a peripheral notch and a flat therein;

means for moving said support means between a first position and a second position;

a first roller extending within said support means and below a supported cassette to frictionally contact a row of wafers therein with said support means in said first position and to lift the wafers within the cassette;

first means for rotating said first roller to cause the wafers in frictional contact with said first roller to rotate within the cassette to bring a notch of a respective wafer into alignment with said roller;

a wafer support assembly for supporting each respective wafer having a notch aligned with and receiving said first roller therein;

a second roller extending in spaced parallel relation to said first roller below the cassette to frictionally contact the row of wafers with said support means in said second position and to lift the wafers within the cassette; and second means for rotating said second roller to cause the wafers in frictional contact therewith to rotate within the cassette.

19. A wafer alignment fixture as set forth in claim 18 which further comprises a handle rotatably mounting said second roller therein and being pivotally mounted on said first roller and said second means includes gear means interconnecting said rollers to each other.

20. A wafer alignment fixture as set forth in claim 18 which further comprises a handle rotatably mounting said second roller therein and being pivotally mounted about an axis of said first roller.

21. A wafer alignment fixture as set forth in claim 20 which further comprises a plate slidably supporting said cassette support means thereon and a bracket mounted on said plate, said bracket having a first surface for supporting said handle thereon with said support means in said first position.

* * * * *